(12) United States Patent
Chou et al.

(10) Patent No.: US 6,652,073 B2
(45) Date of Patent: Nov. 25, 2003

(54) STRUCTURE OF A FLEXIBLE PRINTED CIRCUIT FOR INKJET PRINTHEADS AND THE MANUFACTURING PROCESS THEREFOR

(75) Inventors: Ching-Yu Chou, Taipei (TW); Ching-Te Chou, Taipei (TW)

(73) Assignee: NanoDynamics Inc. (TW)

( * ) Notice: Subject to any disclaimer, the term of this patent is extended or adjusted under 35 U.S.C. 154(b) by 0 days.

(21) Appl. No.: 10/265,583

(22) Filed: Oct. 8, 2002

(65) Prior Publication Data
US 2003/0122897 A1 Jul. 3, 2003

(30) Foreign Application Priority Data
Dec. 31, 2001 (TW) ........................ 90133131 A

(51) Int. Cl.[7] .................................. B41J 2/16
(52) U.S. Cl. ........................................ 347/50
(58) Field of Search ............... 347/50, 20, 1, 347/84, 85, 86; 439/43–85

(56) References Cited

U.S. PATENT DOCUMENTS 6,601,939 B2 * 8/2003 Fujita et al.

* cited by examiner

Primary Examiner—Raquel Yvette Gordon
(74) Attorney, Agent, or Firm—Birch, Stewart, Kolasch & Birch, LLP

(57) ABSTRACT

The invention discloses a manufacturing processing of making a flexible printed circuit for inkjet printheads. Through the change of the flexible printed circuit structure, residual stress at the bent part can be reduced and the efficiency and precision of subsequent processes can be increased. The disclosed process is thus able to make products with high reliability and quality. The process involves the steps of: (1) preparing a flexible printed circuit substrate and making a window at a predetermined bent part; (2) coating the substrate with a metal layer so that the substrate become conductive; (3) etching the metal layer through a photolithography process to produce a conductive circuit on the flexible printed circuit; and (4) forming a cover layer (solder mask materials such as epoxy or acrylic resins) at the window. A flexible printed circuit thus produced is pre-bent, easy to attach and align, and has less residual stress and a cover layer or film at the bent part.

27 Claims, 3 Drawing Sheets

STRUCTURE OF A FLEXIBLE PRINTED CIRCUIT FOR INKJET PRINTHEADS AND THE MANUFACTURING PROCESS THEREFOR

This nonprovisional application claims priority under 35 U.S.C. §119(a) on Patent Application No. 90133131 filed in TAIWAN, R.O.C. on Dec. 31, 2001, which is herein incorporated by reference.

BACKGROUND OF THE INVENTION

1. Field of Invention

The invention relates to the structure of a flexible printed circuit for inkjet printheads and the manufacturing process therefor, so that a deflecting process can be properly performed during the cartridge manufacturing process. It can avoid the crook problem due to collision damages and residual stress in subsequent manufacturing processes or uses.

2. Related Art

The inkjet printhead relies upon the connection between a flexible printed circuit and the printer to transmit the control signals, and thus accurately eject ink to print desired texts or pictures. The assembly of the flexible printed circuit requires deflecting the flexible printed circuit at about the right angle to the side of the inkjet chip.

Current flexible printed circuits are either two-layered or three-layered, and polyamide are used mainly as their substrates. Both of them are coated with a layer of copper or copper alloy on the substrate to form a conductive circuit layer. The difference between these two specifications is in the materials, manufacturing process of the copper conductive circuit and the method of attaching copper or copper alloy onto the polyamide. For those with two-layer structures, the substrate surface is treated with sputtering, evaporation, etc to form a metal layer (e.g. Ni, Cu, and their alloys). The metal layer is then etched using a photolithography process to form a conductive circuit. Afterwards, it is electroplated with a metal such as copper. For those with three-layer structures, the soft substrate surface is further laminated with a metal layer such as a copper foil. The photolithography and etching means are then employed to form a conductive circuit. To prevent the conductive circuit from oxidation or scratches, the completed circuit is selectively covered with a hot plating, solder-mask material, photosensitive material, or metal layer. In general, no matter what kind of flexible printed circuit is chosen, certain rigidity defies against deflection.

Therefore, to ensure the smooth attachment between the flexible printed circuit and the ink cartridge during the flexible printed circuit assembly of the inkjet printhead so that the automatic equipment can precisely align the attachment position, one usually has to bend the flexible printed circuit before fixing and attaching. However, due to the rigidity of the conventional flexible printed circuit, residual stress is generated at the bent part that may change the deflecting angle. Therefore, the alignment becomes hard to control during automatic assembly processes and not each flexible printed circuit can be nicely attached onto the inkjet cartridge. If one tries to increase the strength in deflection, it is quite possible to damage or break the conductive circuit on the flexible printed circuit. Moreover, in the above-mentioned conventional manufacturing process, the deflecting part of the soft circuit is not coated with any cover layer for protection, it is likely to be damaged when the cartridge is mounted or scratched. Another disadvantage of the conventional manufacturing technique is that the residual stress generated during the deflecting process may result in the crook problem.

To improve the deflecting process, to conquer the residual stress problem, and to protect the deflecting part, the invention proposes a better structure and manufacturing process.

SUMMARY OF THE INVENTION

An objective of the invention is to provide a manufacturing process for the flexible printed circuit of inkjet printheads so that the raw material is already pre-bent. It can effectively reduce the residual stress when further deflecting the flexible printed circuit, enhance the smooth attachment to the cartridge, and protect the conductive circuit at the deflecting part from scratches.

The steps of the disclosed manufacturing process include: (1) prepare a flexible printed circuit substrate includes a window therethrough at a predetermined deflecting part; (2) coat a metal layer on the substrate as a conductive metal layer; (3) etch the metal layer using a photolithography procedure to form a conductive circuit on the flexible printed circuit; and (4) apply a cover layer (solder mask such as epoxy or acrylic resins) at the window. A flexible printed circuit thus produced is pre-bent, easy to attach and align, and has less residual stress and a cover layer or film at the bent part.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 1:
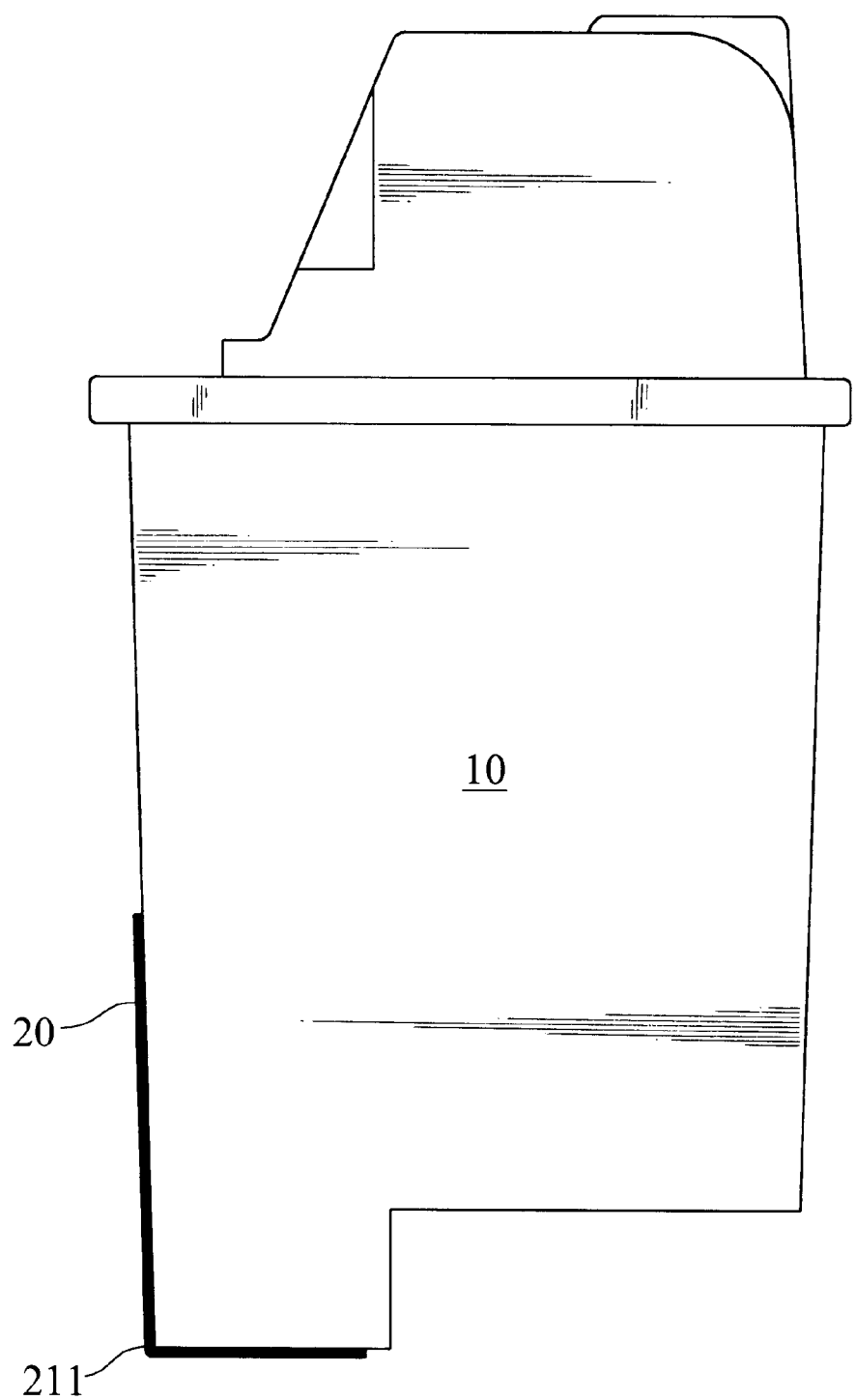
FIG. 1 is a side view of a normal inkjet printhead.

As shown in FIG. 1, the flexible printed circuit 20 of the inkjet printhead 10 has a large angle deflecting part 211. During the assembly process, if a conventional flexible printed circuit is used, it cannot be attached on the inkjet cartridge using a molding formation procedure. Moreover, it cannot be precisely aligned with the predetermined position using automatic equipment.

Figure 2:
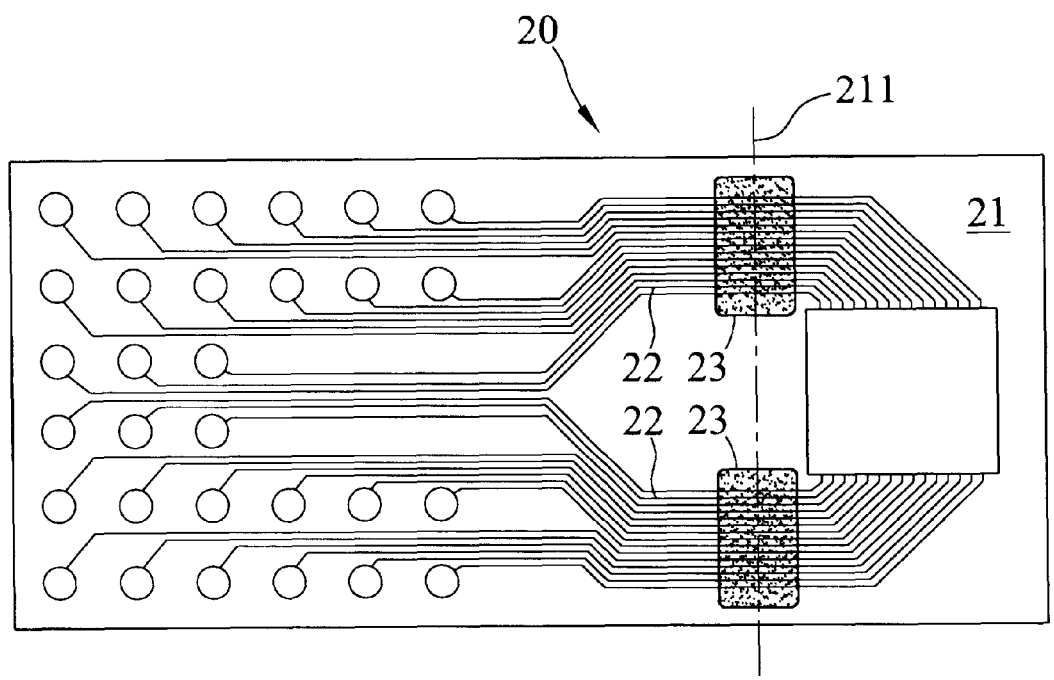
FIG. 2 is a schematic front view of the structure of the disclosed flexible printed circuit.
Figure 3:
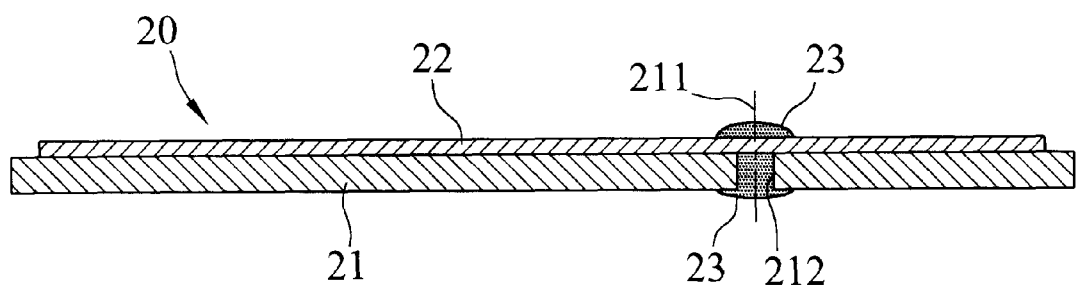
FIG. 3 shows schematically a side cross section of disclosed flexible printed circuit.
Figure 4:
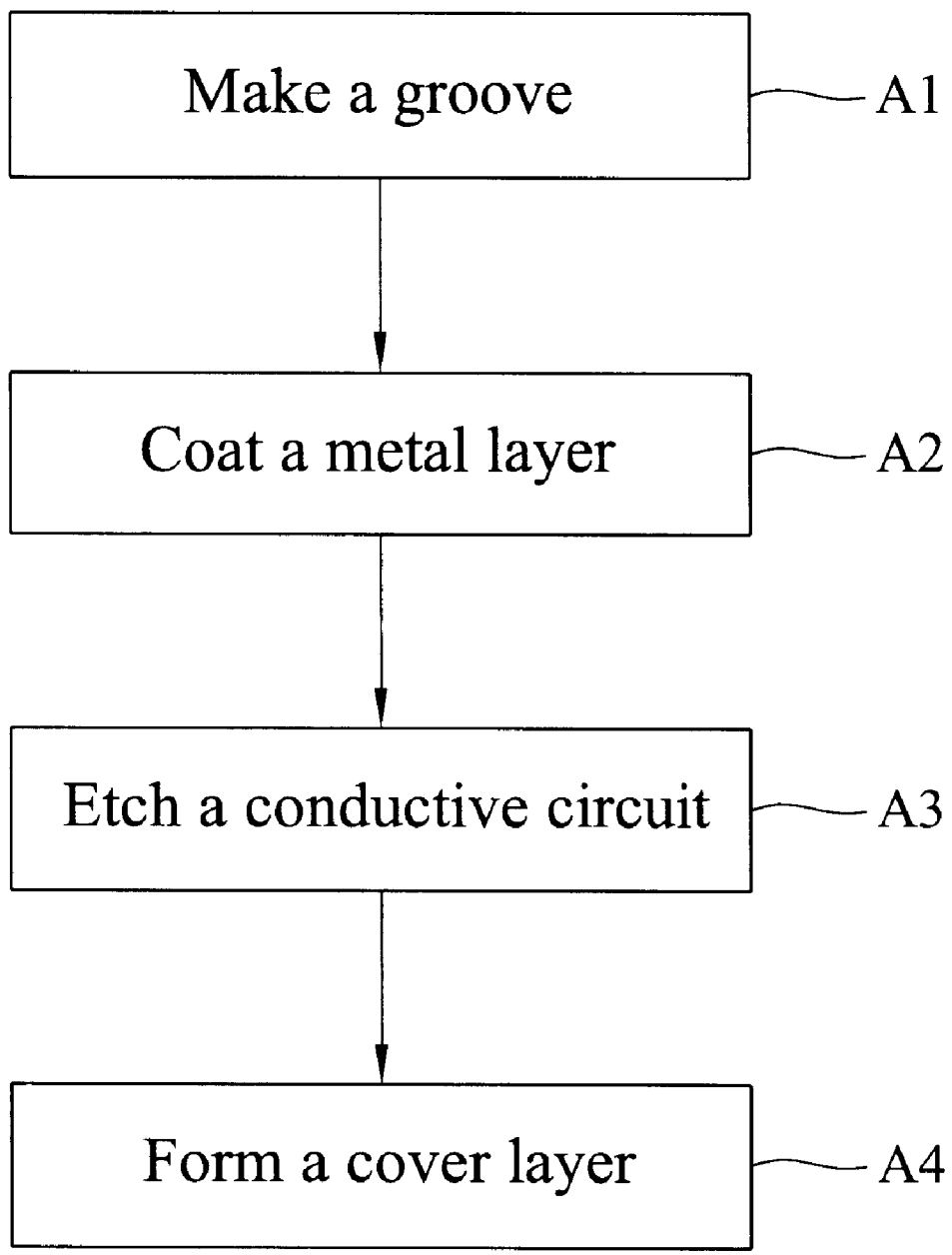
FIG. 4 is a flowchart of the disclosed manufacturing process.

According to embodiments of the invention, one can obtain the flexible printed circuit 20 shown in FIG. 2 or 3. The flexible printed circuit 20 contains a substrate 21, a metal conductive circuit 22, and a cover layer 23. The metal conductive circuit strides over an open region or window 212 through the substrate 21. A cover layer 23 is then formed on and around the window 212 to cover the metal conductive circuit 22.

First Embodiment

As described before, the flexible printed circuit 20 includes a substrate 21, a metal conductive circuit 22, and a cover layer 23. An attachment layer is between the metal conductive circuit 22 and the substrate 21. The substrate 21 is formed with a window 212 at a predetermined deflecting part. The metal conductive circuit 22 strides over the window 212 along the substrate 21. A cover layer 23 is then formed on and around the window 212 to cover the metal conductive circuit 22. The substrate 21 is usually made of polyamide and the metal conductive circuit is made of a copper foil.

The manufacturing process includes the following steps:
1. Make a window A1. Take a flexible printed circuit substrate and make a window 212 at the place to be bent later 211.
2. Apply an attachment layer. Form an adhesive material on the substrate from the previous step.
3. Coat a metal layer A2. Attach a conductive metal foil, such as a copper foil, to the substrate from the previous step.
4. Etch a conductive circuit A3. Use a photolithography process to etch the metal foil, making a conductive circuit 22 of the flexible printed circuit 20 for inkjet printheads 10. The conductive circuit strides over the window 212.
5. Make a cover layer A4. Form a protection cover layer on the window 212. For example, the window 212 can be locally covered with a solder mask or film cover layer, protecting the conductive circuit 22 at the bent part.

Second Embodiment

According to the invention, the structure can include a substrate 21, a metal conductive circuit 22, and a cover layer 23. An evaporation or sputtering metal layer is between the metal conductive circuit 22 and the substrate 21. The substrate 21 is formed with a window 212 at a predetermined bent part. The metal conductive circuit 22 strides over the window 212 along the substrate 21. A cover layer 23 is then formed on and around the window 212 to cover the metal conductive circuit 22. The substrate 21 is usually made of polyamide and the metal conductive circuit is made of a copper foil.

The manufacturing process includes the following steps:
1. Make a window A1. Take a flexible printed circuit substrate and make a window 212 at the place to be bent later 211.
2. Evaporate or sputter a metal. Form a metal material on the substrate from the previous step by evaporation or sputtering.
3. Etch a conductive circuit A3. Use a photolithography process to etch the metal foil, making a conductive circuit 22 of the flexible printed circuit 20 for inkjet printheads 10. The conductive circuit strides over the window 212.
4. Coat a metal layer A2. Attach a conductive metal foil, such as a copper foil, to the substrate from the previous step.
5. Make a cover layer A4. Form a protection cover layer on the window 212. For example, the window 212 can be locally covered with a solder mask or film cover layer, protecting the conductive circuit 22 at the bent part.

Improvements

The disclosed manufacturing process does not accumulate residual stress at the deflecting part of the flexible printed circuit for inkjet cartridges. Therefore, the precision, smoothness and yield of the automatic assembly can be improved. The bent part is further covered with a protection material, preventing the conductive circuit from damages due to scratches and collisions.

What is claimed is:

1. A flexible printed circuit for inkjet printheads bent and flatly attached to one end of an inkjet cartridge and its side, the flexible printed circuit comprising:
   a substrate having at least one opening therethrough at a predetermined deflecting position;
   a metal conductive circuit striding over the opening; and
   a cover layer covering the metal conductive circuit at and around the opening.

2. The flexible printed circuit of claim 1, wherein the substrate is a polyamide sheet.

3. The flexible printed circuit of claim 1, wherein the cover layer is made of a material selected from epoxy and acrylic resins.

4. The flexible printed circuit of claim 1, wherein an attachment layer is inserted between the metal conductive layer and the substrate.

5. The flexible printed circuit of claim 1, wherein the metal conductive layer is a copper foil.

6. The flexible printed circuit of claim 1, wherein a metal material prepared by a method selected from evaporation and sputtering is inserted between the metal conductive circuit and the substrate.

7. The flexible printed circuit of claim 6, wherein the metal material prepared by a method selected from evaporation and sputtering is selected from one of the group consisting of copper and copper alloys.

8. The flexible printed circuit of claim 1, wherein the metal conductive circuit is made of a metal material prepared by a method selected from one of the group consisting of electroplating and electroforming.

9. The flexible printed circuit of claim 8, wherein the metal material prepared by a method selected from electroplating and electroforming is selected from one of the group consisting of copper and copper alloys.

10. The flexible printed circuit of claim 1 further comprising a metal protection layer.

11. The flexible printed circuit of claim 10, wherein the metal protection layer is a material selected from one of the group consisting of nickel, gold, nickel alloys, and gold alloys.

12. A manufacturing process for the flexible printed circuit of inkjet printheads so that the flexible printed circuit is to be bent and flatly attached to one end of an inkjet cartridge and its side, the manufacturing process comprising the steps of:
   providing a flexible printed circuit substrate having at least one opening therethrough;
   attaching a conductive metal foil on the substrate;
   etching the metal foil to form a conductive circuit striding over the opening; and
   applying a cover layer to cover the conductive circuit at and around the opening.

13. The manufacturing process of claim 12, wherein the substrate is a polyamide sheet.

14. The manufacturing process of claim 12, wherein the step of etching the metal foil is achieved by use of photolithography.

15. The manufacturing process of claim 12, wherein the metal foil is a copper foil.

16. The manufacturing process of claim 12, wherein the cover layer is made of a material selected from one of the group consisting of epoxy and acrylic resins.

17. The manufacturing process of claim 12, wherein the step of applying a cover layer is performed on both upper and lower surfaces of the conductive circuit.

18. The manufacturing process of claim 12, wherein the step of applying a cover layer is performed on one of the upper and lower surfaces of the conductive circuit.

19. A manufacturing process for the flexible printed circuit of inkjet printheads so that the flexible printed circuit is to be bent and flatly attached to one end of an inkjet cartridge and its side, the manufacturing process comprising the steps of:

provoding a flexible printed circuit substrate having at least one opening therethrough;

forming a conductive metal foil on the substrate by a method selected from evaporation and sputtering;

etching the metal foil to form a conductive circuit striding over the opening; and applying a cover layer to cover the conductive circuit at and around the opening portion.

20. The manufacturing process of claim 19, wherein the substrate is a polyamide sheet.

21. The manufacturing process of claim 19, wherein the step of etching the metal foil is achieved by use of photolithography.

22. The manufacturing process of claim 19 further comprising the step of forming a second conductive metal layer by a method selected from electroplating and electroforming after the step of forming a conductive metal foil on the substrate by a method selected from evaporation and sputtering.

23. The manufacturing process of claim 22, wherein the second conductive metal layer formed on the substrate by a method selected from electroplating and electroforming is selected from one of the group consisting of copper and copper alloys.

24. The manufacturing process of claim 19, wherein the conductive metal layer formed on the substrate by a method selected from evaporation and sputtering is selected from one of the group consisting of nickel, copper, nickel alloys, and copper alloys.

25. The manufacturing process of claim 19, wherein the cover layer is made of a material selected from epoxy and acrylic resins.

26. The manufacturing process of claim 19, wherein the step of applying a cover layer is performed on both upper and lower surfaces of the conductive circuit.

27. The manufacturing process of claim 19, wherein the step of applying a cover layer is performed on one of the upper and lower surfaces of the conductive circuit.

* * * * *